United States Patent [19]

Hinkel et al.

[11] 4,288,716

[45] Sep. 8, 1981

[54] ION SOURCE HAVING IMPROVED CATHODE

[75] Inventors: Holger Hinkel, Boeblingen; Georg Kraus, Wildberg, both of Fed. Rep. of Germany

[73] Assignee: International Business Machines Corporation, Armonk, N.Y.

[21] Appl. No.: 99,369

[22] Filed: Dec. 3, 1979

[30] Foreign Application Priority Data

Dec. 22, 1978 [DE] Fed. Rep. of Germany ....... 2855864

[51] Int. Cl.³ ............................................. H01J 27/00
[52] U.S. Cl. .................... 313/230; 250/427; 313/359; 313/231.4; 315/111.8
[58] Field of Search .................. 313/230, 231.4, 359, 313/362; 250/426, 427; 315/111.8

[56] References Cited

U.S. PATENT DOCUMENTS 3,364,355 1/1968 Ruby et al. ................... 313/230 X

FOREIGN PATENT DOCUMENTS 792042 3/1958 United Kingdom ............... 250/427

OTHER PUBLICATIONS

Dearnaley et al., Ion Implantation, Atomic Energy Research Establishment, Harwell, England, 1973, pp. 324–327.

*Primary Examiner*—Stanley T. Krawczewicz
*Attorney, Agent, or Firm*—E. Ronald Coffman

[57] ABSTRACT

A direct heated rod-shaped cathode for an ion source is provided with a region of reduced cross-section adjacent its negative end to maximize the path length of electron movement within the discharge chamber and to provide effective control of the cathode resistance in a region that is relatively free of sputtering erosion during use.

3 Claims, 10 Drawing Figures

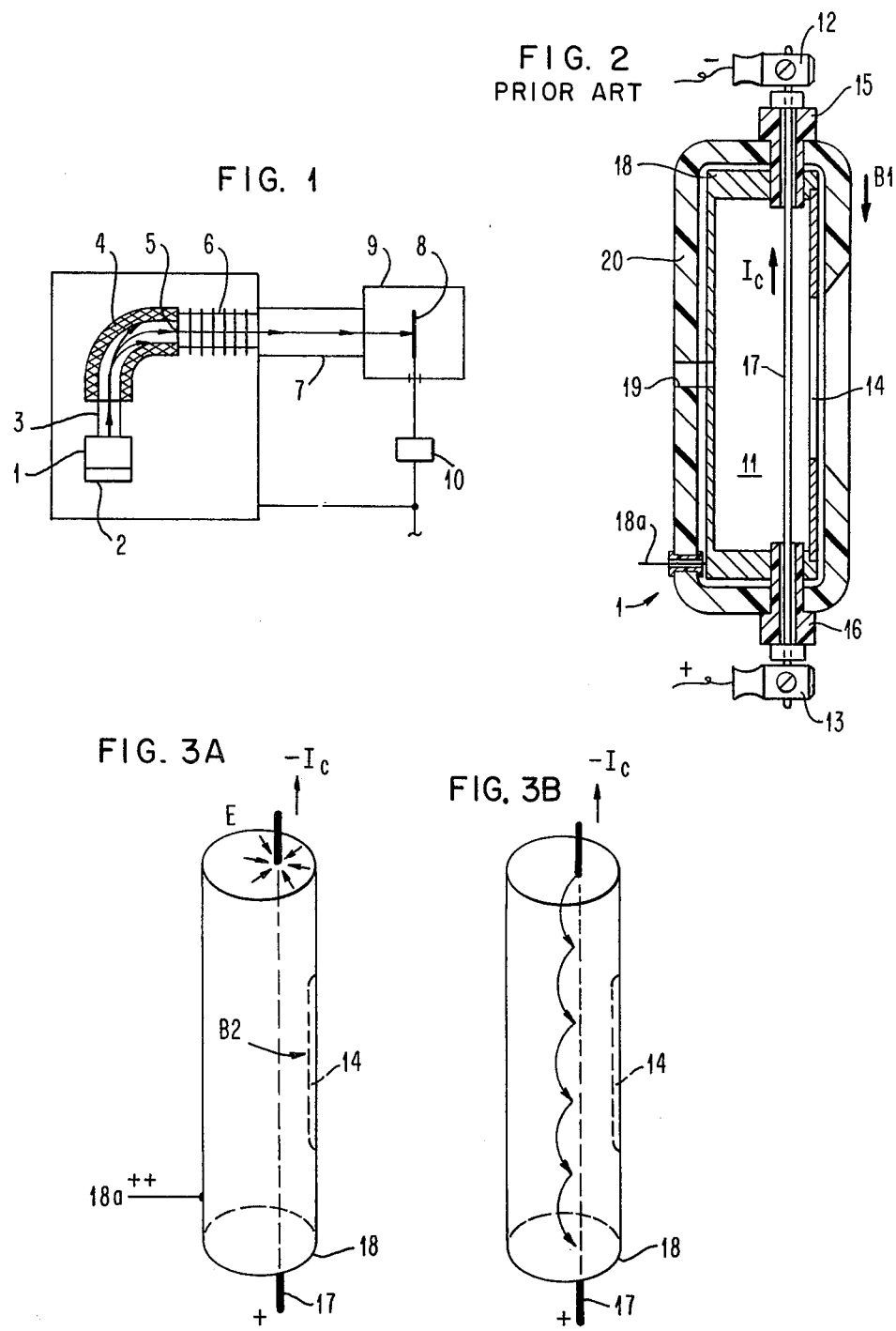

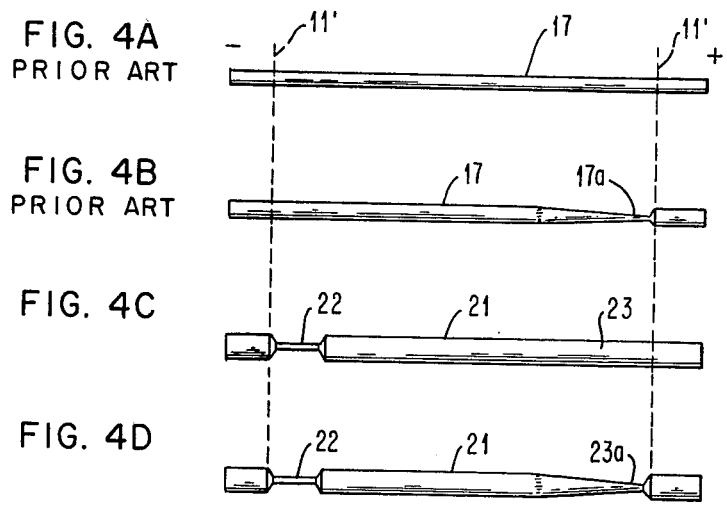
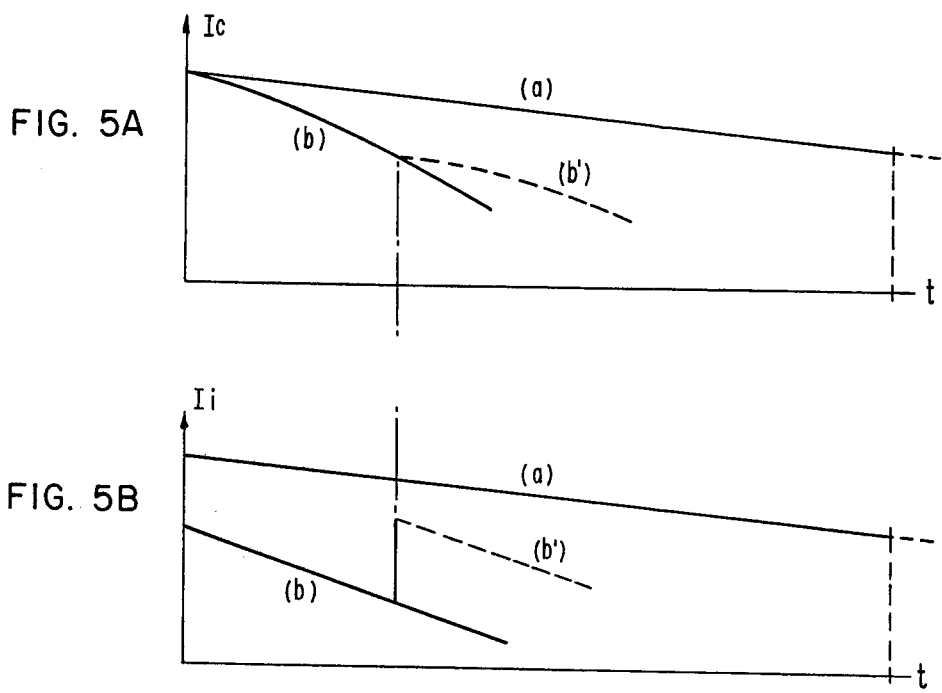

ION SOURCE HAVING IMPROVED CATHODE

This invention concerns an ion source of the type having a directly DC heated, rod-shaped cathode supported in a housing which forms an anode therearound to provide a discharge chamber for the generation of ions which can thereafter be extracted via electric or magnetic extraction fields. Ion sources of this type are employed in ion implantation doping of semiconductor materials in the manufacture of semiconductor devices and integrated circuits. By bombarding a monocrystal with heavy, high-energy ions, the properties in a surface layer of the crystal are modified and the monocrystal is thereby doped. Doping by ion implantation can be accurately controlled, both with regard to geometric dimensions and the concentration distribution of the implanted dopants.

Ion implantation is effected by generating a supply of ions by means of a suitable source device, selecting the particular ions desired with a mass separator and focusing and accelerating the ions in the form of a beam that is directed onto the semiconductor surface to be doped. By means of a deflection system, the ion beam can be guided across the entire surface. As the ions hit the semiconductor surface, a portion of the ions enter the semiconductor body as a result of their high kinetic energy.

The ion source is an essential component of this process. The ion source is required to efficiently generate all desired types of ions at a high ion current and with a minimum of maintenance. To obtain a high ion current, a hot cathode ion source is preferred over a cold cathode source. High doping requirements, for example, in the production of the emitter and subcollector zone of bipolar transistors, necessitate high ion currents (in the milliampere range) for production throughput to be, for example, 10 semiconductor wafers per hour.

Both rod-shaped and U-shaped hot cathodes are known. A rod-shaped cathode has the advantage of producing a very stable plasma and being operable without an external magnetic field. It suffers the disadvantages of having a rather limited maximum ion current, e.g. about 2 mA in the case of arsenic, and a limited service life due to the eventual destruction of the cathode by sputter erosion. While the U-shaped cathode erodes less rapidly and supplies higher ion currents, its plasma stability is low and an external magnetic field is required for operation.

An object of this invention thus has been to provide an ion source having a directly DC heated, rod-shaped cathode which has an improved service life, as well as an increased maximum extractable ion current.

This object is achieved by providing the rod-shaped cathode with a primary emission region positioned adjacent the negative input end of the cathode to maximize the length of the electron path through the ionization chamber, thereby increasing the probability of ionization impacts between electrons and neutral gas molecules introduced into the chamber. The primary emission region is created by providing a reduced cross-sectional area or neck in the rod-shaped cathode adjacent the end to which negative potential will be attached. The resistance heating of the cathode thus will concentrate in the region of the reduced cross-section to increase electron emission in that region. In addition, the reduced cross-section forms the primary current limiting factor of the cathode such that erosion of other portions of the cathode will have little resultant effect on the heating current conducted by the cathode. Conversely, it is possible to increase the cross-sectional dimension of the cathode in regions subject to high erosion since current control is provided by the reduced area section.

These and other objects, features and advantages of our invention will be apparent to those skilled in the art from the following description of a preferred embodiment thereof, and wherein reference is made to the accompanying drawings of which:

FIG. 1 is a simplified schematic representation of a known ion implantation system, FIG. 2 is an enlarged simplified cross-sectional view of a rod-shaped hot cathode ion source as is known in the prior art and to which this invention is directed, FIG. 3A is a simplified perspective view of a rod-shaped cathode source illustrating the electric and magnetic fields in the region of the cathode within a discharge chamber, FIG. 3B is a simplified perspective view similar to FIG. 3A, illustrating a typical path of electrons emitted by the cathode, FIG. 4A is a side elevational view of a simple known form of rod-shaped cathode in the unused state, FIG. 4B is a side elevational view of the rod-shaped cathode as shown in FIG. 4A after a period of use has caused erosion, FIG. 4C is a side elevational view of a rod-shaped cathode constructed in accordance with this invention as it appears in the unused state, FIG. 4D is a side elevational view of the rod-shaped cathode shown in FIG. 4C after a period of use has caused erosion thereof, FIG. 5A is a comparative graph of the cathode current Ic as it varies over the period of use t for a cathode (curve a) constructed in accordance with this invention and a cathode (curve b) of the type shown in FIG. 4A, FIG. 5B is a comparative graph of the ion current Ii for a cathode (curve a) constructed in accordance with this invention and a cathode (curve b) of a cathode of the type shown in FIG. 4A.

The principal components of an ion implantation system can be understood by reference to FIG. 1. Ion source or generator 1 comprises a discharge chamber wherein a dopant 2 is split into atomic and molecular components and ionized to produce a mixture of different kinds of ions. Extraction and focusing means 3, arranged at the output of source 1, provides an electrical field of several kv/cm to extract the ions from the source 1 and focus the ion beam onto the entry slit of a mass separator 4. Separator 4 includes a deflection magnet for sorting out of the plurality of different ions supplied by the ion source, those ions with the mass and charge required for doping. Thus a beam of selected ions, having an exactly defined energy, leaves the mass separator 4 via an output diaphragm 5. This ion beam then passes an acceleration line 6 where it is focused to a suitable diameter by means of electrostatic lenses. A deflection unit 7 directs the accelerated high-energy ions to the plane of irradiation 8 in an irradiation chamber 9. The deflection unit 7 guides the focal point of the ion beam in the desired manner across the plane of irradiation in which the sample to be irradiated is arranged. A current integrator 10 determines the number of implanted ions on the basis of their charges. The whole beam guide system, together with the irradiation chamber, is maintained at a high vacuum.

FIG. 2 shows the principal components of a known ion source 1 with which the cathode of this invention can be used. Ion source 1 comprises an electrically conductive housing 18, defining an elongated cylindrical discharge chamber 11. An axially extending slit 14 in the housing 18 provides an ion beam exit. Insulated connectors 15 and 16, mounted on opposed ends of the housing 18, support a rod-shaped electrode or cathode 17 within the discharge chamber 11. Cathode 17 can be made, for example, of tungsten and is provided through negative and positive contacts 12 and 13 respectively, with a source of electrical power to produce a current Ic therein, whereby the cathode 17 is directly heated. The cathode 17 is preferably not supported on the center axis of the discharge chamber 11, but is slightly shifted toward the slit 14.

An inlet 19 opens into housing 18 for the introduction of the dopant to be ionized. The dopant can be, for example, in the form of a suitable gas. A heat shield 20 surrounds the housing 18 on all sides.

In operation, a power supply (not shown) biases the housing 18 (via electrical connection 18a) to be positive with respect to the cathode 17, thereby making the housing 18 the anode of the discharge chamber 11. The cathode 17, being heated by conduction between contacts 12 and 13, emits electrons into the electric field created between the cathode 17 and the housing/anode 18. Collision of the emitted electrons with the gas molecules introduced through inlet 19 into the discharge chamber 11 causes ionization of the gas and a glow discharge occurs. An additional electric field provided by means 3 (FIG. 1) extracts a portion of the ions generated through slit 14. In many instances, an additional external magnetic field B1 is provided. The further course of the ion beam thus formed has been described above. The main disadvantage of the known ion sources of this type will be described below by means of FIGS. 3A and 3B, as well as 4A and 4B. FIGS. 3A and 3B show the discharge chamber housing 18, the extraction slit 14, and the cathode 17. The electrical connections described above create an electrostatic field E, (FIG. 3A) that tends to drive heavy positive ions toward cathode 17 as shown by the arrows. Impingement of these heavy positive ions on the cathode 17 causes sputter erosion which eventually will destroy the cathode. In addition, the cathode current Ic is relatively high, e.g., 150A, and creates a magnetic field B2. This magnetic field urges the emitted electrons toward the positive end of the cathode 17. The movement of the electrons may be representated as pseudo-cycloid along the cathode as shown in FIG. 3B. The resulting increased population of electrons near the positive end of the cathode causes increased ionization in this region and localized increased erosion of the cathode 17 adjacent its positive end. The effect of such erosion for the known rod-shaped cathode 17 with a uniform cross-section may be seen from FIGS. 4A and 4B. FIG. 4A shows this known cathode in the new or unused state. Broken lines 11' represent the opposed ends of chamber 11. FIG. 4B shows the cathode 17 in the used or eroded state. A tapered eroded section 17a has been formed adjacent the positive end of the cathode 17. This progressive tapering affects the performance and determines the service life of the cathode 17 as illustrated by curve b in FIGS. 5A and 5B. Thus it is seen how the cathode current Ic decreases with service time as a result of erosion of the cathode increasing its ohmic resistance near the positive end. The ion current Ii which is a function of the heating from cathode current Ic, drops rapidly also.

By reversing the polarity of the unilaterally eroded, conventional cathode, the drop of the cathode current Ic is initially slowed down, which may be seen from the broken line curve b', FIG. 5A. It is even more significant, however, that this reversal of polarity, during which the eroded end becomes the negative pole, causes the ion current Ii to leap to a value which is about 50 to 70% higher than that of a new, conventional cathode. This is shown by the broken line curve b', FIG. 5B. Our understanding of this behavior is that the localized erosion of the positive end of the cathode 17 causes increased local heating of the cathode with a resultant increase in the emission of electrons in the vicinity of the eroded cross-section. If the eroded cross-section is placed at the negative end of the cathode as by polarity reversal following erosion, the electrons emitted from this section have the entire length of the discharge chamber 17 to move, thereby increasing considerably the probability of ionization.

In accordance with our invention, a rod-shaped cathode 21 (FIG. 4C) is provided for use in place of the cathode 17 in an ion source 1 such as that illustrated in FIG. 2. Cathode 21 includes a reduced cross-section primary emission region 22 at one end which is to be connected to the negative terminal 12 of the ion source 1. Cathode 21 also includes a generally increased cross-section at other regions, particularly the region 23 adjacent the end to be attached to the positive terminal 13 of the ion source 1. The cross-section of region 22 is made considerably smaller than the positive end region 23 such that the geometry of the region 22 essentially determines the resistance of the cathode throughout its service life. Thus, as a result of the erosion tapering 23a (see FIG. 4D), there is only a relatively slight increase in the overall cathode resistance.

The performance of the cathode of this invention is shown as curve a in FIGS. 5A and 5B. Thus the cathode current Ic which provides cathode heating drops only slightly, remaining relatively constant for most of the service life of the cathode. Curve a in FIG. 5B shows that ion current Ii remains relatively constant throughout the period of use t. In addition, by locating the reduced cross-section region 22 at the negative end of the cathode, concentrated heating at this end causes most of the electrons to be emitted from this region. These electrons then may move axially a relatively long distance under the influence of magnetic field B2 (FIG. 3A) before reaching the positive end of the cathode 21. This increased path length for the electrons increases the probability of ionization so that the absolute value of the ion current obtainable is also considerably increased, as represented by the vertical displacement between curves a and b in FIG. 5B.

In summary, it now can be seen that the resistance of the conventional cathode increases greatly during operation (by about 100%), while the increase encountered with the cathode of this invention is only slight (about 20%). As a result, in the course of time there is a noticeable drop in the cathode current in the first case and only a slight drop in the second case.

During operation of the conventional cathode, the ion current Ii drops considerably in the course of time because of the decreasing cathode current Ic (decreasing heating power) and because the region of high resistance develops toward the positive end of the cathode, minimizing the electron path length. Both disadvantages are eliminated with the cathode 21 constructed in accordance with this invention. The resistance of the cathode and thus the cathode current Ic is almost constant during the entire operating period, and the region of high resistance is always at the negative end of the cathode. In addition, by employing a cathode having a greater cross-section at its positive end, the service life of the cathode can be prolonged.

Having thus described our invention, what we claim as new, and desire to secure by Letters Patent is:

1. An ion generator having a housing forming a chamber, means for supporting a cathode within the housing, means for establishing an electrostatic field between the cathode and the housing, positive and negative terminals for applying a DC voltage across opposite ends of the cathode to induce a heating current therein, and means for supplying a source of ionizable molecules into said chamber, wherein the improvement comprises:

the cathode having a region of reduced cross-section with respect to the cross-section of the remainder of the cathode, said reduced cross-section region being located nearer said negative terminal than said positive terminal.

2. An ion generator as defined in claim 1 wherein said reduced cross-section region is located immediately adjacent one end of the chamber.

3. An ion source as defined in claim 1 wherein the difference in cross-section of said reduced cross-section region and the remainder of said cathode is such that the electrical resistance of the cathode is essentially determined by said reduced cross-section region.

* * * * *